(12) United States Patent
Eguchi et al.

(10) Patent No.: US 10,026,663 B2
(45) Date of Patent: Jul. 17, 2018

(54) SEMICONDUCTOR WAFER AND SEMICONDUCTOR DEVICE MANUFACTURING METHOD

(71) Applicant: DENSO CORPORATION, Kariya, Aichi-pref. (JP)

(72) Inventors: Kouji Eguchi, Kariya (JP); Takashi Nakano, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/515,212

(22) PCT Filed: Nov. 13, 2015

(86) PCT No.: PCT/JP2015/005681
§ 371 (c)(1),
(2) Date: Mar. 29, 2017

(87) PCT Pub. No.: WO2016/079969
PCT Pub. Date: May 26, 2016

(65) Prior Publication Data
US 2017/0221782 A1 Aug. 3, 2017

(30) Foreign Application Priority Data

Nov. 19, 2014 (JP) .................. 2014-234574
Oct. 27, 2015 (JP) .................. 2015-210988

(51) Int. Cl.
*H01L 21/66* (2006.01)
*H01L 21/78* (2006.01)
*H01L 21/02* (2006.01)

(52) U.S. Cl.
CPC ........ *H01L 22/32* (2013.01); *H01L 21/02008* (2013.01); *H01L 21/02035* (2013.01); *H01L 21/78* (2013.01); *H01L 22/34* (2013.01)

(58) Field of Classification Search
CPC ............... H01L 22/32; H01L 21/02008; H01L 21/02035; H01L 21/78
(Continued)

(56) References Cited

U.S. PATENT DOCUMENTS

| 5,981,971 | A | 11/1999 | Miyakawa |
| 6,365,443 | B1 | 4/2002 | Hagiwara et al. |
| 7,126,225 | B2 | 10/2006 | Su et al. |
| 2004/0077128 | A1 | 4/2004 | Makabe et al. |

(Continued)

FOREIGN PATENT DOCUMENTS

| JP | 2001-060567 A | 3/2001 |
| JP | 2002-190456 A | 7/2002 |

(Continued)

*Primary Examiner* — Cuong Q Nguyen
*Assistant Examiner* — Tong-Ho Kim
(74) *Attorney, Agent, or Firm* — Posz Law Group, PLC

(57) ABSTRACT

A semiconductor device manufacturing method is provided. In a semiconductor wafer prepared, the width of a dicing line is larger than a cut region to be diced with a dicing blade, a first chip forming region and a second chip forming region are adjacent and have the dicing line therebetween, some of the pads are formed on a first chip forming region side, and the remaining pads are formed on a second chip forming region side. The semiconductor wafer is diced with the dicing blade in such manner that, when the some of the pads are diced, a part of the dicing blade on the second chip forming region side does not abut the some of the pads, and, when the remaining pads are diced, a part of the dicing blade on the first one chip forming region side does not abut the remaining pads.

11 Claims, 9 Drawing Sheets

(58) Field of Classification Search
USPC .................................... 257/48, 686; 438/462
See application file for complete search history.

(56) References Cited

U.S. PATENT DOCUMENTS

| | | |
|---|---|---|
| 2006/0157700 A1 | 7/2006 | Winter et al. |
| 2006/0231926 A1 | 10/2006 | Makabe et al. |
| 2007/0052085 A1* | 3/2007 | Nagai ..................... H01L 24/12 257/690 |
| 2008/0293219 A1 | 11/2008 | Makabe et al. |
| 2009/0121337 A1* | 5/2009 | Abe .................. B23K 26/0057 257/686 |
| 2009/0272973 A1 | 11/2009 | Yoshida et al. |
| 2011/0124180 A1 | 5/2011 | Abe et al. |
| 2011/0215481 A1 | 9/2011 | Nagai et al. |
| 2011/0304061 A1 | 12/2011 | Ishida et al. |
| 2012/0077332 A1 | 3/2012 | Abe et al. |
| 2012/0313094 A1 | 12/2012 | Kato |
| 2013/0069206 A1 | 3/2013 | Yoshizawa et al. |
| 2014/0252643 A1 | 9/2014 | Abe et al. |
| 2015/0035125 A1 | 2/2015 | Yoshizawa et al. |
| 2015/0235973 A1 | 8/2015 | Abe et al. |
| 2016/0218069 A1 | 7/2016 | Yoshizawa et al. |

FOREIGN PATENT DOCUMENTS

| | | | |
|---|---|---|---|
| JP | 2002190456 A | * | 7/2002 |
| JP | 2005-191334 A | | 7/2005 |
| JP | 2012-023278 A | | 2/2012 |
| JP | 2012023278 A | * | 2/2012 |
| JP | 2013-105919 A | | 5/2013 |
| JP | 2013-143514 A | | 7/2013 |
| JP | 2014-116507 A | | 6/2014 |

* cited by examiner

SEMICONDUCTOR WAFER AND SEMICONDUCTOR DEVICE MANUFACTURING METHOD

CROSS REFERENCE TO RELATED APPLICATIONS

This application is a U.S. national stage of International Patent Application No. PCT/JP2015/005681 filed on Nov. 13, 2015 and is based on Japanese Patent Applications No. 2014-234574 filed on Nov. 19, 2014 and No. 2015-210988 filed on Nov. 27, 2015, disclosures of which are incorporated herein by reference.

TECHNICAL FIELD

The present disclosure relates to a semiconductor wafer and a semiconductor device manufacturing method for manufacturing a semiconductor device by dicing the semiconductor wafer along a dicing line.

BACKGROUND ART

There is known a method of manufacturing a semiconductor device by forming a predetermined semiconductor element in a chip forming region on a semiconductor wafer, forming an inspection element (TEG element) for inspecting the characteristics of the semiconductor element in a dicing line, inspecting the characteristics of the semiconductor element by inspecting the inspection element, and successively dicing the semiconductor wafer along the dicing line. Here, in the dicing line, a pad connected electrically to the inspection element, abutting on a probe needle of a testing apparatus, and comprising a metal film is also formed together with the inspection element.

In the case of dicing a semiconductor wafer along a dicing line with a dicing blade however, particles of a metal constituting a pad (metal film) attach to the dicing blade when the pad connected to an inspection element is diced. As a result, an irregular stress is likely to be applied to the dicing line (semiconductor wafer) from the dicing blade by the attachment of the metal particles and chipping and cracking may be generated in the dicing line in some cases. Then, when the chipping and cracking propagate in a chip forming region, the characteristics of a semiconductor device may change undesirably.

In order to solve the problem for example, Patent Literature 1 discloses a method of: preparing a semiconductor wafer in which a pad is formed in a portion of a dicing line closer to one of adjacent chip forming regions; and using a dicing blade so that the part of the dicing blade closer to the other chip forming region may not abut the pad when dicing is applied. According to the literature, because the part of a dicing blade closer to the other chip forming region does not touch a pad when a semiconductor wafer is diced with the dicing blade, metal particles are restrained from attaching to the part. In other words, the total quantity of metal particles attaching to a dicing blade can be reduced. As a result, chipping and cracking can be restrained from being generated in a dicing line.

PRIOR ART LITERATURE

Patent Literature

Patent Literature 1: JP2012-256787A

SUMMARY OF INVENTION

By the above manufacturing method of a semiconductor device however, since every pad is arranged in a portion of the dicing line closer to the one chip forming region, a large stress may possibly be generated in the portion closer to the one chip forming region. As a result, the stress may possibly cause chipping, cracking, and the like to be generated.

Further, it is also conceivable to miniaturize the pad in order to reduce a metal film (pad) diced with a dicing blade. When a pad is miniaturized however, sophisticated positional precision is required for abutting a probe needle to the pad and a manufacturing process may be complicated undesirably. Moreover, a probe needle conforming to the pad has to be newly prepared.

An object of the present disclosure is, in view of the above situation, to provide a semiconductor wafer and a manufacturing method of a semiconductor device using the semiconductor wafer, allowing chipping and cracking to be restrained from being generated in a dicing line without a manufacturing process complicated.

A semiconductor device manufacturing method in an aspect of the present disclosure comprises: preparing a semiconductor wafer in which a plurality of chip forming regions are partitioned by a dicing line, a semiconductor element is formed in each of the chip forming regions, and a plurality of inspection elements having same characteristics as the semiconductor elements are formed in the dicing line and a plurality of pads connected electrically to the inspection elements are formed in the dicing line; inspecting the characteristics of the semiconductor elements by inspecting the characteristics of the inspection elements; and dicing the semiconductor wafer along the dicing line with a dicing blade. In the semiconductor wafer prepared in the semiconductor wafer preparing process: the width of the dicing line is larger than a cut region to be diced with the dicing blade; a first chip forming region and a second chip forming region are the chip forming regions that are adjacent and that have the dicing line therebetween; some of the pads are formed on a first chip forming region side; and the remaining pads are formed on a second chip forming region side. In the semiconductor wafer dicing process, the semiconductor wafer is diced with the dicing blade in such manner: when the some of the pads formed on the first chip forming region side are diced, a part of the dicing blade on the second chip forming region side does not abut the some of the pads; and when the remaining pads formed on the second chip forming region side are diced, a part of the dicing blade on the first chip forming region side does not abut the remaining pads.

According to this semiconductor device manufacturing method, among the pads formed in the dicing line, some of the pads are formed on the first chip forming region side and the remaining pads are formed on the second chip forming region side, wherein the first chip forming region and the second chip forming region are the chip forming regions that are adjacent and that have the dicing line therebetween. As a result, when dicing is applied, a large stress is restrained from being generated only either one of the first chip forming region side and the second chip forming side.

Further, the dicing is applied to the dicing line in such manner that: when the some of the pads formed on the first chip forming region side are diced, the part of the dicing blade on the second chip forming region side does not abut the some of the pads; and, when the remaining pads formed on the second chip forming region side are diced, the part of the dicing blade on the second chip forming region side do not abut the remaining pads. As a result, metal particles can be restrained from attaching to a dicing blade part not touching the pads and chipping and cracking can be restrained from being generated in the dicing line.

Furthermore, since a pad is not required to be miniaturized, a testing apparatus having a probe needle similar to a conventional one can be used. In other words, according to the above semiconductor device manufacturing method, chipping and cracking can be restrained from being introduced into the dicing line without a manufacturing process complicated.

A semiconductor wafer in an aspect of the present disclosure comprises: a plurality of chip forming regions partitioned by a dicing line; a plurality of inspection elements formed in the dicing line and having same characteristics as semiconductor elements formed in the respective chip forming regions; and a plurality of pads formed in the dicing line and connected electrically to the respective inspection elements. The width of the dicing line is larger than a cut region to be diced with a dicing blade. A first chip forming region and a second chip forming region are the chip forming regions that are adjacent and that have the dicing line therebetween. Some of the pads are formed on a first chip forming region side. The remaining pads are formed on a second chip forming region side.

According to this semiconductor wafer, some of the pads are formed on the first chip forming region side and the remaining pads are formed on the second chip forming region side, wherein the first chip forming region and the second chip forming region are the chip forming regions that are adjacent and that have the dicing line therebetween. As a result, when dicing is applied, a large stress is restrained from being generated only either one of the first chip forming region side and the second chip forming side.

Further, metal particles can be restrained from attaching to a dicing blade part not touching the pads, by dicing the semiconductor wafer along the dicing line in such manner that: when the some of the pads formed on the first chip forming region side are diced, the part of the dicing blade on the second chip forming region side does not abut the some of the pads; and, when the remaining pads formed on the second chip forming region side are diced, the part of the dicing blade on the first chip forming region side do not abut the remaining pads. As a result, chipping and cracking can be restrained from being generated in the dicing line.

Furthermore, since such a semiconductor wafer is not required to miniaturize a pad, a testing apparatus having a probe needle similar to a conventional one can be used. In other words, according to the above semiconductor wafer, when the semiconductor wafer is diced along a dicing line, chipping and cracking can be restrained from being introduced into the dicing line without a manufacturing process complicated.

BRIEF DESCRIPTION OF THE DRAWINGS

The above and other objects, features, and advantages on the present disclosure will be more apparent from the following detailed description made with reference to the accompanying drawings. In the attached drawings.

EMBODIMENTS FOR CARRYING OUT INVENTION

A plurality of embodiments are explained hereunder in reference to drawings. Here, in the following embodiments, parts nearly identical to each other are explained with an identical symbol.

(First Embodiment)

A first embodiment is explained in reference to drawings.

Figure 1:
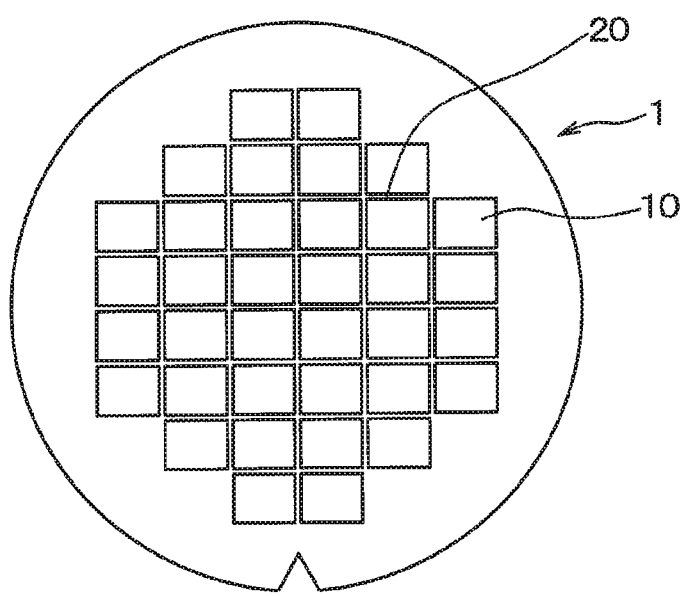
FIG. 1 is a plan view of a semiconductor wafer according to a first embodiment.

Firstly as shown in FIG. 1, a semiconductor wafer 1 having a plurality of chip forming regions 10 partitioned by a dicing line 20 is prepared. In other words, a semiconductor wafer 1 having a dicing line 20 between chip forming regions 10 is prepared. Here, the width of the dicing line 20 is larger than the thickness of a dicing blade 30 (a cut region 20a actually diced with the dicing blade 30) that will be described later. The structure of a semiconductor wafer 1 prepared in the present embodiment is hereunder explained concretely.

A semiconductor wafer 1 has a wafer such as a silicon wafer and a semiconductor element such as a MOSFET element or a diode element is formed in each of chip forming regions 10. Further, an interlayer insulation film, a wiring layer, a pad, and others are formed appropriately over the wafer.

Figure 2:
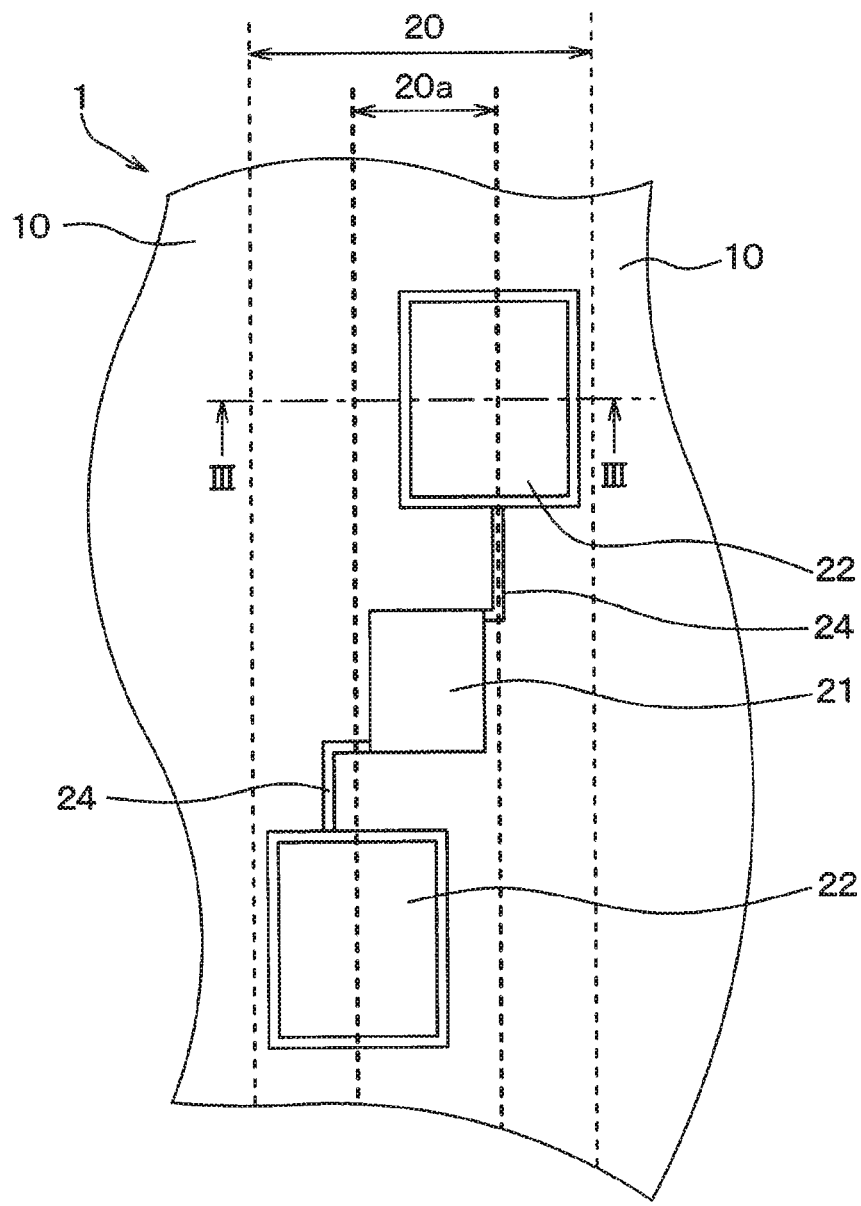
FIG. 2 is a schematic plan view of a dicing line in FIG. 1.

Further, in a dicing line 20, as shown in FIG. 2, formed are: a plurality of inspection elements (TEG elements) 21 having the same characteristics as semiconductor elements formed in chip forming regions 10; and a plurality of pads 22 connected electrically to the inspection elements 21 and abutted by probe needles installed in a testing apparatus at an inspection process.

Figure 3:
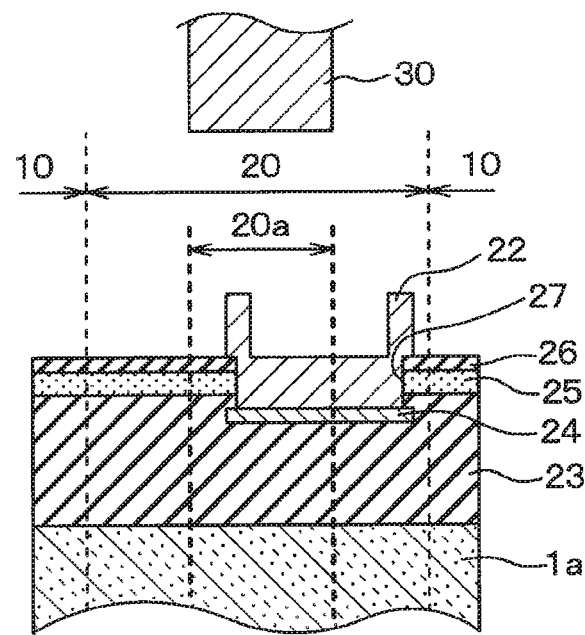
FIG. 3 is a sectional view taken on line III-III in FIG. 2.

The configuration of a part where a pad 22 is formed is explained here. As shown in FIG. 3, at a part where a pad 22 is formed, an interlayer insulation film 23 comprising TEOS (Tetra Ethyl Ortho Silicate) or the like is formed over a wafer 1a and a wiring layer 24 comprising aluminum (Al) or the like and connected electrically to an inspection element 21 is formed in the interior of the interlayer insulation film 23.

Here, the interlayer insulation film 23 is actually formed by stacking a plurality of layers and a wiring layer 24 is connected electrically to an inspection element 21 by being formed appropriately over each of the layers on a cross section different from FIG. 3. Meanwhile, FIG. 2 is a schematic plan view of a dicing line 20 and shows a positional relationship among an inspection element 21, pads 22, and wiring layers 24 and the inspection element 21, the pads 22, and the wiring layers 24 are formed at different places (heights) in practice.

Then over the interlayer insulation film 23, a nitride film 25 having a lower permeability of moisture (water drops or water vapor) than the interlayer insulation film 23 is arranged. Further, over the nitride film 25, a protective insulation film 26 having a lower hardness and a higher adhesiveness with a metal than the nitride film 25 is arranged. In the present embodiment, the protective insulation film 26 comprises TEOS or the like similarly to the interlayer insulation film 23.

A via-hole 27 penetrating the protective insulation film 26, the nitride film 25, and the interlayer insulation film 23 and exposing the wiring layer 24 is formed in the protective insulation film 26, the nitride film 25, and the interlayer insulation film 23. Then the pad 22 comprising a metal such as Al or AlCu, connected electrically and mechanically to the wiring layer 24, and connected electrically to an external circuit is embedded into the via-hole 27.

In the present embodiment, a pad 22 is manufactured as follows. That is, after a via-hole 27 penetrating a protective insulation film 26, a nitride film 25, and an interlayer insulation film 23 is formed, a metal film is formed so as to be embedded into the via-hole 27 by a PVD (Physical Vapor Deposition) method or the like. Then a pad 22 is manufactured by patterning the metal film deposited over the protective insulation film 26. As a result, the pad 22 takes the shape of depressing the inner region (the part allocated in the via-hole 27). More specifically, in a pad 22 shown in FIG. 2, a line that forms a rectangle on the inner side represents a boundary between a depressed inner region and a not-depressed outer periphery.

Figure 4:
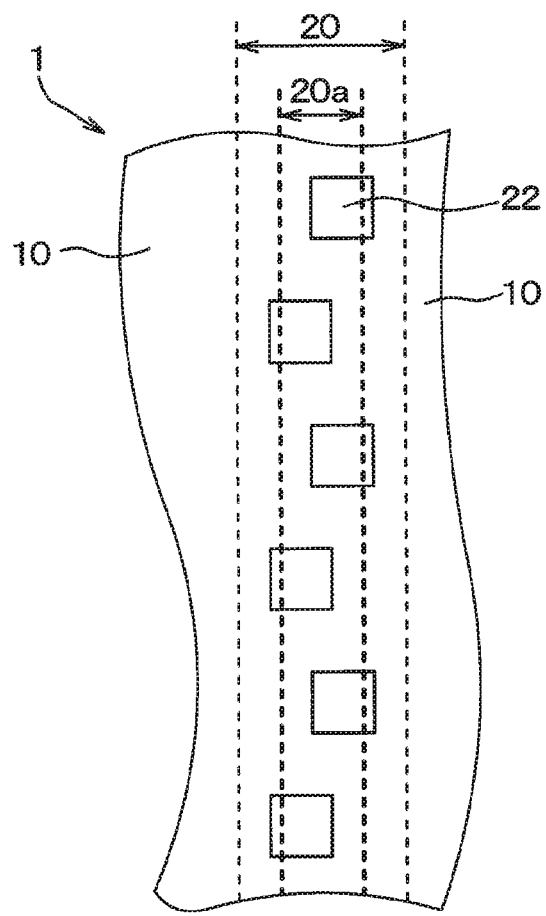
FIG. 4 is a schematic view showing a relationship between pads formed in a dicing line and adjacent chip forming regions.

Successively, an arrangement order of pads 22 according to the present embodiment is explained. In the present embodiment, a plurality of pads 22 are formed in a dicing line 20 so that, as shown in FIGS. 2 and 4: some of the pads 22 may be formed closer to one of adjacent chip forming regions 10 (a chip forming region 10 on the right side of the plane in FIGS. 2 and 4); and the rest of the pads 22 may be formed closer to the other chip forming region 10 (a chip forming region 10 on the left side of the plane in FIGS. 2 and 4). Then the pads 22 formed on the one chip forming region 10 side and the pads 22 formed on the other chip forming region 10 side are formed alternately in the extending directions of the dicing line 20 (vertical directions on the plane in FIGS. 2 and 4).

More specifically further, the width of a dicing line 20 is larger than the thickness of a dicing blade 30 and the dicing blade 30 dices the center of the dicing line 20 at a process of dicing a semiconductor wafer 1 that will be described later. In other words, the center of the dicing line 20 constitutes a cut region 20a cut actually by the dicing blade 30. The pads 22 arranged on the one chip forming region 10 side are formed so that the parts on the one chip forming region 10 side may protrude from the cut region 20a. The pads 22 arranged on the other chip forming region 10 side are formed so that the parts on the other chip forming region 10 side may protrude from the cut region 20a.

In the present embodiment, such a semiconductor wafer 1 as stated above is prepared. Successively, the characteristics of a semiconductor element formed in each of chip forming regions 10 are inspected. More specifically, an inspection element 21 formed in a dicing line 20 is configured so as to have the same characteristics as a semiconductor element formed in each of chip forming regions 10. As a result, the characteristics of a semiconductor element formed in each of chip forming regions 10 are inspected by abutting a probe needle of a testing apparatus to a pad 22 connected electrically to an inspection element 21 formed in a dicing line 20 and inspecting the characteristics of the inspection element 21.

Successively as shown in FIG. 3, the semiconductor wafer 1 is divided into chip units by dicing the semiconductor wafer 1 along the dicing line 20 with a dicing blade 30. In the present embodiment, a semiconductor device is manufactured by; using a dicing blade 30 having a diamond abrasive grain layer; dicing the nearly center of a dicing line 20 with the dicing blade 30; and thus dividing each of chip forming regions 10 into chip units.

On this occasion, pads 22 are formed in a dicing line 20 so that pads 22 formed on the one chip forming region 10 side in adjacent chip forming regions 10 and pads 22 formed on the other chip forming region 10 side may alternately formed. Then the pads 22 are diced in such manner that: when a pad 22 formed on the one chip forming region 10 side is diced, the part of the dicing blade 30 on the other chip forming region 10 side may not abut the pad 22; and, when a pad 22 formed on the other chip forming region 10 side is diced, the part of the dicing blade 30 on the one chip forming region 10 side may not abut the pad 22.

By dicing a pad 22 in this way, a metal film hardly attaches to the part of a dicing blade 30 not abutting the pad 22 and a stress is hardly applied to a semiconductor wafer 1. Further, pads 22 formed in a dicing line 20 are formed on the one chip forming region 10 side and on the other chip forming region 10 side. As a result, when dicing is applied, a large stress is restrained from being applied only on the chip forming regions 10 side. Chipping and cracking can therefore be restrained from being generated in a dicing line 20.

As explained above, in the present embodiment, some of pads 22 formed in a dicing line 20 are formed on the one chip forming region 10 side in adjacent chip forming regions 10 and the remaining pads 22 are formed on the other chip forming region 10 side. As a result, when dicing is applied, a large stress is restrained from being applied only on the chip forming regions 10 side.

Further, a dicing line 20 is diced in such manner that: when some of pads 22 formed on the one chip forming region 10 side are diced, the part of a dicing blade 30 on the other chip forming region 10 side may not abut the pads 22; and, when the remaining pads 22 formed on the other chip forming region 10 side are diced, the part of the dicing blade 30 on the one chip forming region 10 side may not abut the pads 22. As a result, metal particles are restrained from attaching to the part of the dicing blade 30 not abutting the pads 22 and chipping and cracking can be restrained from being generated in the dicing line 20.

Furthermore, since a pad 22 is not required to be miniaturized, a testing apparatus having a probe needle similar to a conventional one can be used. As a result, chipping and cracking can be restrained from being introduced into a dicing line 20 without a manufacturing process complicated.

(Second Embodiment)

A second embodiment is explained. The present embodiment is a case of changing a site where a via-hole 27 is formed from the first embodiment. The others are similar to the first embodiment and hence the explanations are omitted here.

Figure 5:
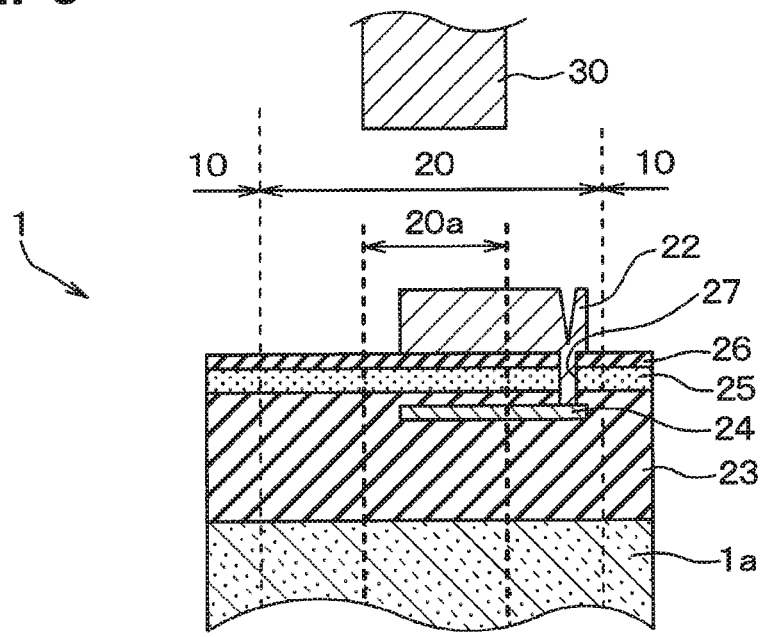
FIG. 5 is a sectional view of a part of a dicing line including a pad according to a second embodiment.
Figure 6:
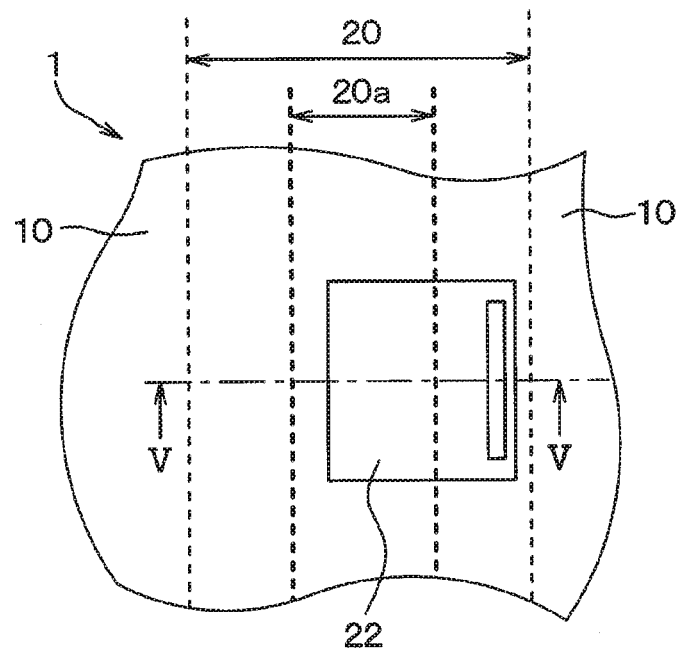
FIG. 6 is a plan view showing the vicinity of the pad shown in FIG. 5.

In the present embodiment, when preparing a semiconductor wafer 1, a semiconductor wafer 1 is prepared in which a via-hole 27 is formed in a region different from a cut region 20a in a dicing line 20 as shown in FIGS. 5 and 6. In other words, a semiconductor wafer 1 is prepared in which a part of a pad 22 embedded into a via-hole 27 is located in a region different from a cut region 20a in a dicing line 20.

Here, FIG. 5 corresponds to a cross section taken on line V-V in FIG. 6. Further, FIG. 5 is a sectional view of a part including a pad 22 formed on the one chip forming region 10 side, FIG. 6 is a schematic view of a part including the pad 22 formed on the one chip forming region 10 side, and a via-hole 27 is arranged in a region different from a cut region 20a by being arranged on the one chip forming region 10 side. In a sectional view and a schematic view of a part including a pad 22 formed on the other chip forming region 10 side in contrast, although they are not particularly shown, a via-hole 27 is arranged in a region different from a cut region 20a by being arranged on the other chip forming region 10 side.

Further, in the present embodiment, the opening of a via-hole 27 has a rectangular shape the long side of which is parallel with the directions of a dicing line 20 (vertical directions on the plane of FIG. 6). As a result, the depressed part of the pad 22 takes a rectangular shape the long side of which is parallel with the directions of the dicing line 20. Here the line forming an inside rectangle in the pad 22 in FIG. 6 represents a boundary between a depressed inner region and a not-depressed outer periphery.

According to the present embodiment, since a part of a pad 22 embedded into a via-hole 27 is not diced when a semiconductor wafer 1 is diced with a dicing blade 30, the same effects as the first embodiment can be obtained while a metal film to be diced is reduced.

(Third Embodiment)

A third embodiment is explained. The present embodiment is a case of changing the shape of a wiring layer 24 from the second embodiment. The others are similar to the second embodiment and hence the explanations are omitted here.

Figure 7:
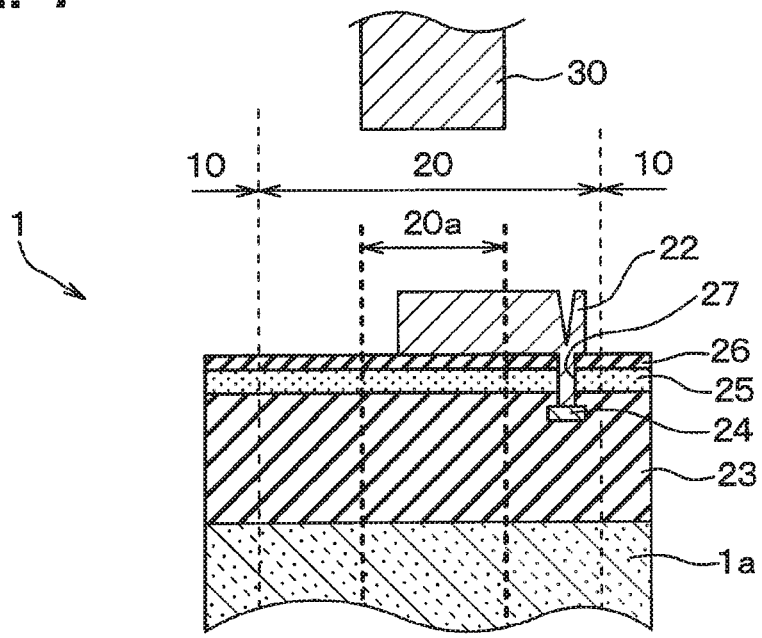
FIG. 7 is a sectional view of a part of a dicing line including a pad according to a third embodiment.

In the present embodiment, when preparing a semiconductor wafer 1, a semiconductor wafer 1 is prepared in which a part of a wiring layer 24 facing a pad 22 is formed only in a region different from a cut region 20a in a dicing line 20 as shown in FIG. 7. Specifically, the part of the wiring layer 24 is formed closer to one chip forming region 10 than the cut region 20a.

Here, FIG. 7 corresponds to a cross section taken on line V-V in FIG. 6. Further, FIG. 7 is a sectional view of a part including a pad 22 formed on the one chip forming region 10 side and a part of a wiring layer 24 facing the pad 22 is arranged in a region different from a cut region 20a by being arranged on the one chip forming region 10 side. In a sectional view of a part including a pad 22 formed on the other chip forming region 10 side in contrast, although it is not particularly shown, a part of a wiring layer 24 facing the pad 22 is arranged in a region different from a cut region 20a by being arranged on the other chip forming region 10 side.

According to the present embodiment, since a part of a wiring layer 24 facing a pad 22 is also not diced when a semiconductor wafer 1 is diced with a dicing blade 30, the same effects as the second embodiment can further be obtained while a metal film to be diced is reduced.

(Fourth Embodiment)

A fourth embodiment is explained. The present embodiment is a case of changing the shape of a via-hole 27 from the third embodiment. The others are similar to the third embodiment and hence the explanations are omitted here.

Figure 8:
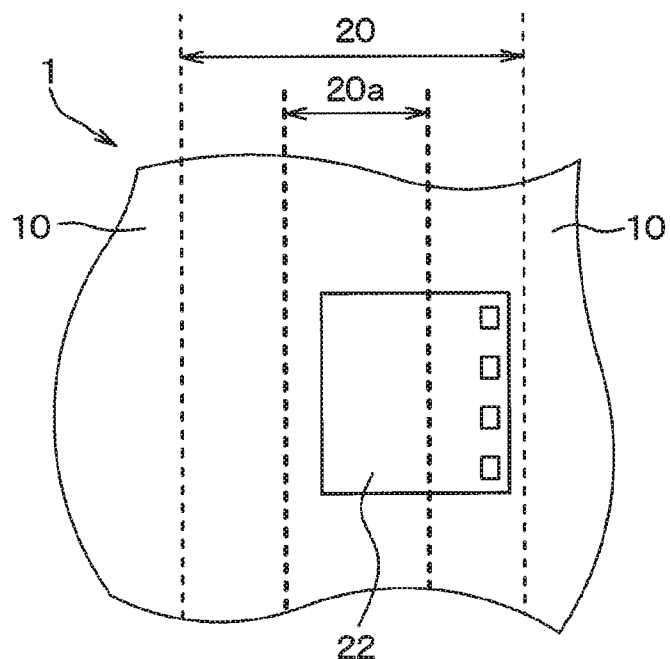
FIG. 8 is a plan view of a part of a dicing line including a pad according to a fourth embodiment.

In the present embodiment, when preparing a semiconductor wafer 1, prepared is a semiconductor wafer 1 is prepared in which a plurality of via-holes 27 are formed as shown in FIG. 8. Since a plurality of via-holes 27 are formed in a region different from a cut region 20a in a dicing line 20 even when the via-holes 27 are formed in this way, the same effects as the third embodiment can be obtained.

Here, FIG. 8 is a schematic view of a part including a pad 22 formed on the one chip forming region 10 side and via-holes 27 are arranged in a region different from a cut region 20a by being arranged on the one chip forming region 10 side. Further, in a schematic view of a part including a pad 22 formed on the other chip forming region 10 side, although it is not particularly shown, via-holes 27 are arranged in a region different from a cut region 20a by being arranged on the other chip forming region 10 side.

(Fifth Embodiment)

A fifth embodiment is explained. The present embodiment is a case of changing sites where via-holes 27 are formed from the fourth embodiment. The others are similar to the fourth embodiment and hence the explanations are omitted here.

Figure 9:
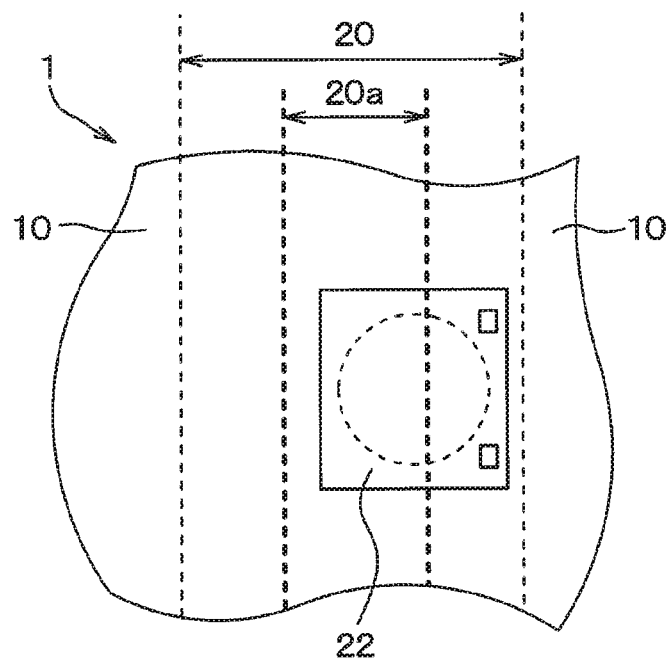
FIG. 9 is a plan view of a part of a dicing line including a pad according to a fifth embodiment.

In the present embodiment, when preparing a semiconductor wafer 1, a semiconductor wafer 1 is prepared in which via-holes 27 are formed under a part of a pad 22 different from a part of the pad 22 which a probe needle installed in a testing apparatus can abut when the pad 22 is viewed from the direction of a normal perpendicular to the plane of the semiconductor wafer 1 as shown in FIG. 9. That is, a semiconductor wafer 1 is prepared in which depressed parts of a pad 22 (the rectangles in the pad 22 in FIG. 9) are located at parts of the pad 22 different from a part which a probe needle installed in a testing apparatus can abut. For example, when a probe needle abuts a circle (formed by a dotted line in the pad 22 in FIG. 9) including the center of the pad 22 and having a predetermined radius, via-holes 27 are formed so as to form depressed parts of the pad 22 outside the part which the probe needle abuts. In the present embodiment, the pad 22 has a rectangular shape in a plan view and via-holes 27 are formed so that the depressed parts may be located in the vicinities of the corners of the rectangular shape and in a region different from a cut region 20a. Here, FIG. 9 is a schematic view of a part including a pad 22 formed on the one chip forming region 10 side.

According to the present embodiment, a pad 22 is depressed at parts embedded into via-holes 27 but the depressed parts are located in a region different from a region which a probe needle can abut. As a result, since a probe needle abuts a planar plane of a pad 22 when the probe needle abuts the pad 22, the same effects as the fourth embodiment can be obtained while a stress caused by abutting a probe needle is restrained from concentrating at a specific site.

(Sixth Embodiment)

A sixth embodiment is explained. The present embodiment is a case of changing sites where a via-hole 27 and a wiring layer 24 are formed from the third embodiment. The others are similar to the third embodiment and hence the explanations are omitted here.

Figure 10:
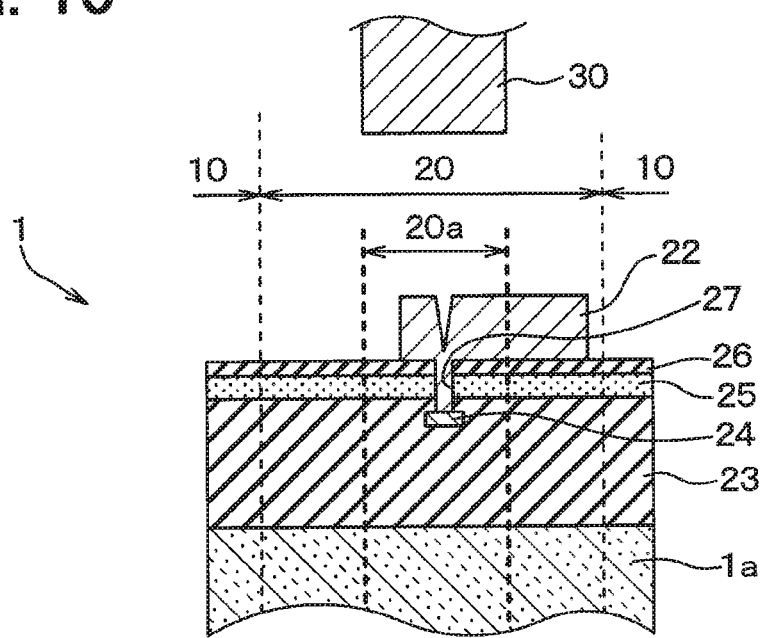
FIG. 10 is a sectional view of a part of a dicing line including a pad according to a sixth embodiment.

In the present embodiment, when preparing a semiconductor wafer 1, a semiconductor wafer 1 is prepared in which a via-hole 27 is formed only in a cut region 20a in a dicing line 20 and a part of a wiring layer 24 facing a pad 22 is formed only in the cut region 20a as shown in FIG. 10. Meanwhile, that a via-hole 27 is formed only in a cut region 20a means that a part of a pad 22 embedded into the via-hole 27 is arranged only in the cut region 20a. Here, FIG. 10 is a sectional view of a part including a pad 22 formed on the one chip forming region 10 side.

According to the present embodiment, when a semiconductor wafer 1 is diced with a dicing blade 30, the whole part of a wiring layer 24 facing a pad 22 is removed and hence, after the part of the wiring layer 24 is removed, a part of the pad 22 that mechanically fixes a not-diced part does not exist. As a result, when dicing is applied, the not-diced part of the pad 22 can be exfoliated and scattered. For example in FIG. 10, a part of a pad 22 on the one chip forming region 10 side is not diced but is likely to be exfoliated because the pad 22 is not mechanically connected to a wiring layer 24. Since the whole pad 22 that has been formed in a dicing line 20 is removed (exfoliated) beforehand when a divided semiconductor device is mounted over a mounting member or the like or in another case after the semiconductor wafer 1 is diced and divided into chip units therefore, a remaining part (metal film) of the pad 22 can be restrained from attaching to the mounting member.

(Seventh Embodiment)

A seventh embodiment is explained. The present embodiment is a case of arranging connection-vias comprising a metal different from a pad 22 in via-holes 27 in the first embodiment. The others are similar to the first embodiment and hence the explanations are omitted here.

Figure 11:
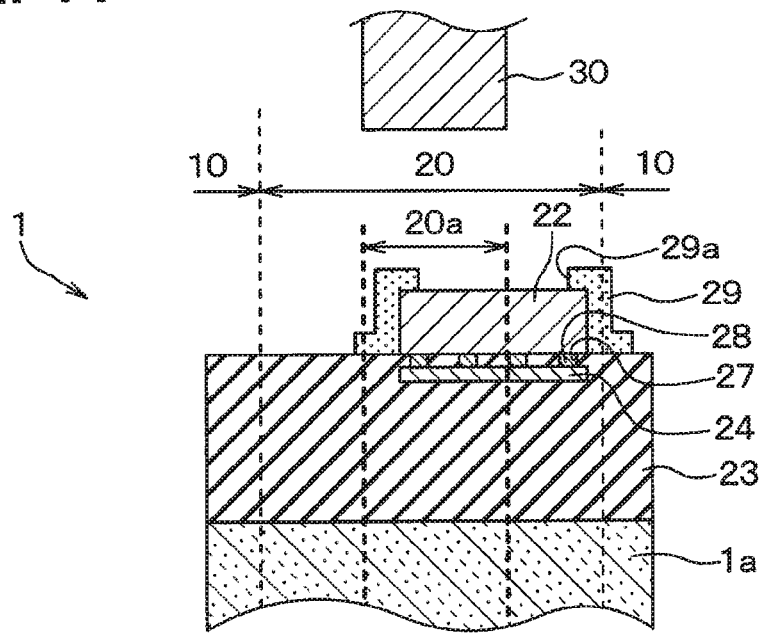
FIG. 11 is a sectional view of a part of a dicing line including a pad according to a seventh embodiment.
Figure 12:
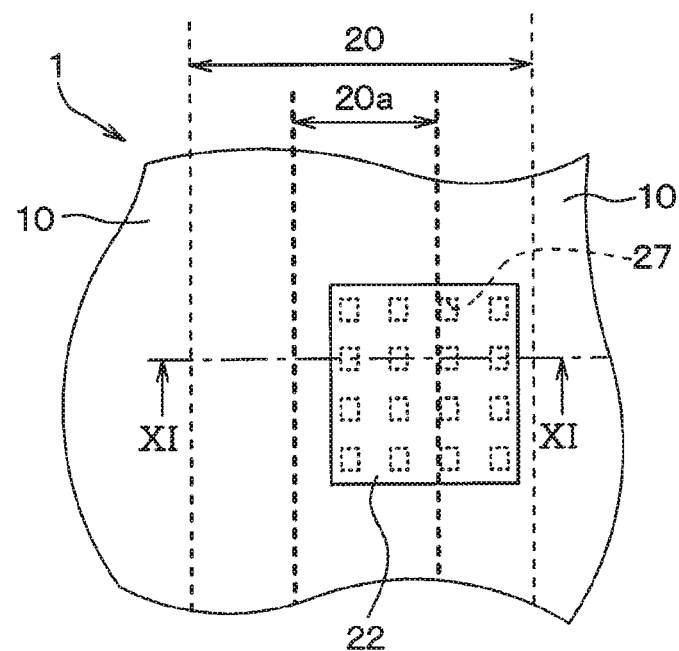
FIG. 12 is a plan view showing the vicinity of the pad shown in FIG. 11.

In the present embodiment, when preparing a semiconductor wafer 1, a semiconductor wafer 1 is prepared in which connection-vias 28 (metal members) comprising a metal different from a pad 22 are embedded into via-holes 27 and the pad 22 is connected electrically and mechanically to a wiring layer 24 with the connection-vies 28 interposed as shown in FIGS. 11 and 12.

Here, FIG. 11 corresponds to a cross section taken on line XI-XI in FIG. 12. Further, FIG. 11 is a sectional view of a part including a pad 22 formed on the one chip forming region 10 side and FIG. 12 is a schematic view of a part including the pad 22 formed on the one chip forming region 10 side.

In the present embodiment, an opening of each of the via-holes 27 is a square 0.15 μm or less on a side and the connection-vias 28 comprise a metal containing tungsten. The reason is as follows.

That is, when a pad 22 comprises a metal containing aluminum (Al) or the like, generally a metal film constituting the pad 22 is formed by a sputtering method but, if a via-hole 27 is small (the lengths of facing sidewalls being 0.15 μm or less), the metal film is not formed so as to be embedded completely into the via-hole 27 by the sputtering method in some cases. In the present embodiment therefore, a film of a metal containing tungsten is formed by a CVD method so that the metal film may be completely embedded into a via-hole 27 and thus a connection-via 28 comprises a metal containing tungsten.

Meanwhile, when a metal containing tungsten is embedded into via-holes 27 by a CVD method as shown in the present embodiment, the metal film is formed also over an interlayer insulation film 23 and hence a pad 22 is formed after the metal film formed over the interlayer insulation film 23 is removed by a CMP method or the like. Further in the present embodiment, connection-vias 28 are embedded into via-holes 27 and hence the face of a pad 22 on the opposite side of an interlayer insulation film 23 is a planar plane. Moreover, in the present embodiment, since the length of a side of an opening of each via-hole 27 is small, a metal film is hardly embedded into the via-holes 27 if the via-holes 27 are excessively deep. For the reason, neither a nitride film 25 nor a protective insulation film 26 is formed over an interlayer insulation film 23 and a pad 22 is formed directly on an interlayer insulation film 23.

Further, as stated above, a pad 22 is connected mechanically to a wiring layer 24 through connection-vias 28 comprising a metal different from the pad 22 and the wiring layer 24 and the mechanical connection strength between the pad 22 and the wiring layer 24 may possibly reduce. For the reason, over an interlayer insulation film 23, an opening 29a exposing an inner region of a part of the pad 22 on the opposite side of an interlayer insulation film 23 is formed and a reinforcing film 29 covering an outer periphery is formed so that a not-diced part of the pad 22 may not scatter during dicing. Here, the inner region of the pad 22 is a part which a probe needle of a testing apparatus abuts at an inspection process. In the present embodiment, the reinforcing film 29 comprises a nitride film or the like.

As explained above, when connection-vias 28 comprising a metal different from a pad 22 are arranged in via-holes 27 too, the same effects as the first embodiment can be obtained. Here, although above explanations have been made based on the example of arranging a reinforcing film 29, the reinforcing film 29 may not be arranged.

(Eighth Embodiment)

An eighth embodiment is explained. The present embodiment is a case of changing a site where a wiring layer 24 is formed from the first embodiment. The others are similar to the first embodiment and hence the explanations are omitted here.

Figure 13:
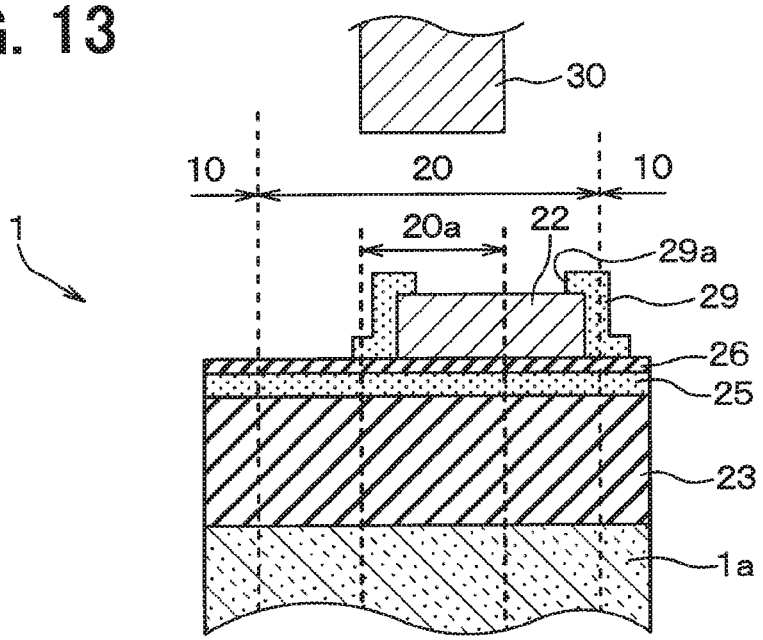
FIG. 13 is a sectional view of a part of a dicing line including a pad according to an eighth embodiment.

In the present embodiment, when preparing a semiconductor wafer 1, a semiconductor wafer 1 is prepared in which a wiring layer 24 is not formed under a pad 22 as shown in FIG. 13. FIG. 13 is a sectional view of a part including a pad 22 formed on the one chip forming region 10 side. Here, since a wiring layer 24 is not formed under a pad 22, a via-hole 27 is not formed in a protective insulation film 26, a nitride film 25, and an interlayer insulation film 23. Further, in the present embodiment, a wiring layer 24 is connected electrically to a pad 22 over a protective insulation film 26 in a different cross section from FIG. 3.

Then over the protective insulation film 26, an opening 29a exposing an inner region of a part of the pad 22 on the opposite side of the interlayer insulation film 23 is formed and a reinforcing film 29 covering an outer periphery is formed in the same manner as the seventh embodiment.

In this way, when a semiconductor wafer 1 in which a wiring layer 24 is not formed under a pad 22 is prepared too, the same effects as the first embodiment can be obtained.

(Ninth Embodiment)

A ninth embodiment is explained. The present embodiment is a case of changing the arrangement order of pads 22 from the first embodiment. The others are similar to the first embodiment and hence the explanations are omitted here.

Figure 14:
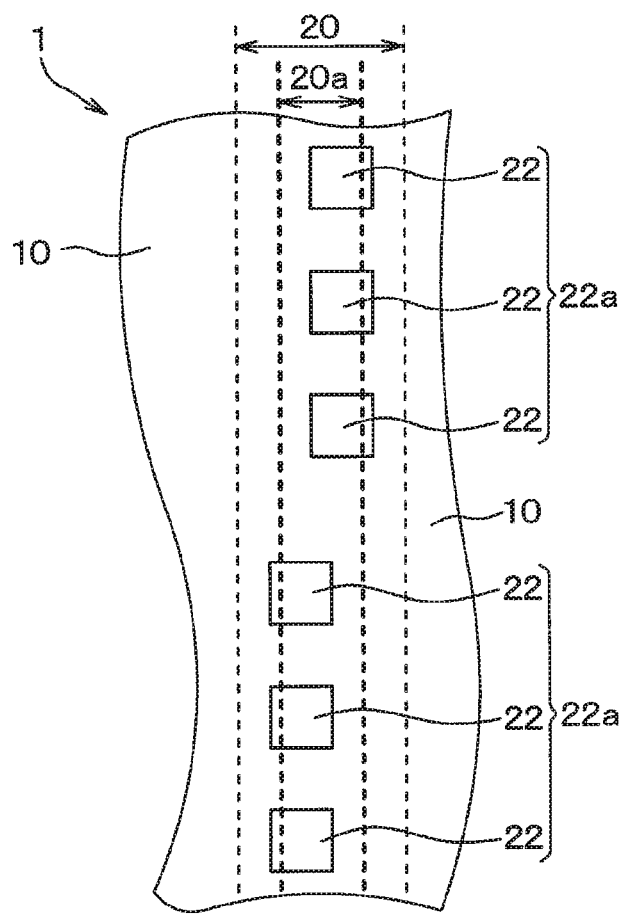
FIG. 14 is a schematic view showing a relationship between pads formed in a dicing line and adjacent chip forming regions according to a ninth embodiment.

In the present embodiment, as a testing apparatus, used is a testing apparatus having three probe needles arranged so that a virtual line connecting the tips of the probe needles abutting pads 22 may be linear and the intervals of the tips of the probe needles may be equal. That is, as a testing apparatus, used is a testing apparatus in which the tips of three probe needles are arranged evenly and linearly. Then when preparing a semiconductor wafer 1, a semiconductor wafer 1 is prepared in which a plurality of pads 22 formed in a dicing line 20 are formed so that a group of three pads 22 may be formed on the side of either chip forming region 10 in adjacent chip forming regions 10 as shown in FIG. 14. In other words, a semiconductor wafer 1 is prepared in which groups each of which comprises pads 22 of the same number as probe needles are formed alternately on both the sides of adjacent chip forming regions 10. That is, a semiconductor wafer 1 is prepared in which a plurality of pads 22 are grouped into groups 22a each of which comprises pads 22 of the same number as probe needles and each of the groups 22a is formed on the side of either of adjacent chip forming regions 10. Here, a virtual line connecting the pads 22 in a group 22a is linear and the intervals of the pads 22 are equal to the intervals of the probe needles. Briefly, pads 22 in a group 22a are arranged in conformity with the arrangement shape of probe needles.

As explained above, a plurality of pads 22 formed in a dicing line 20 may not be formed alternately in the extending directions of the dicing line 20.

Meanwhile, when an inspection process is carried out, usually inspection elements 21 are inspected by abutting a plurality of probe needles installed in a testing apparatus simultaneously onto a plurality of pads 22. As a result, as shown in the present embodiment, probe needles can be abutted directly onto pads 22 at an inspection process by: grouping a plurality of pads 22 formed in a dicing line 20 into groups 22a each of which comprises pads 22 of the same number as probe needles; and arranging the pads 22 in each of the groups 22a in conformity with the arrangement shape of the probe needles. An inspection process therefore can be simplified.

Here, FIG. 14 illustrates the case where the intervals between adjacent groups 22a are larger than the intervals between adjacent pads 22 in a group 22a in order to comprehend the configuration of the groups 22a easily. The intervals between adjacent groups 22a however may be equal to or shorter than the intervals between adjacent pads 22 in a group 22a.

(Modification of Ninth Embodiment)

Figure 15:
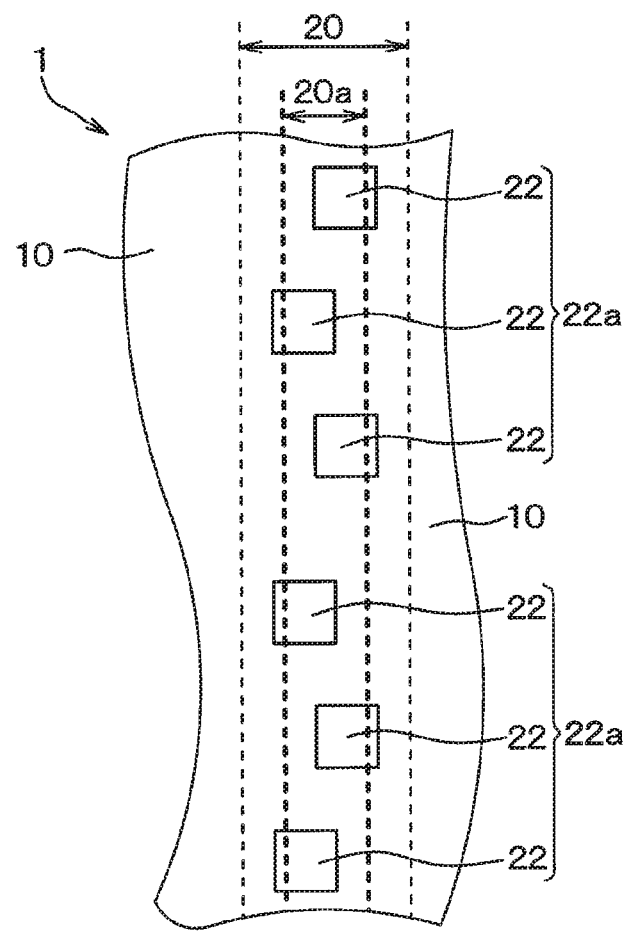
FIG. 15 is a schematic view showing a relationship between pads formed in a dicing line and adjacent chip forming regions according to a modification of the ninth embodiment.

A modification of the ninth embodiment is explained. In the ninth embodiment, a testing apparatus in which a virtual line connecting the tips of probe needles is not linear may be used and for example a testing apparatus in which a virtual line connecting the tips of probe needles is zigzag may be used. When an inspection process is carried out with such a testing apparatus, by arranging pads 22 zigzag in conformity with the arrangement shape of probe needles in each group 22a as shown in FIG. 15, the same effects as the ninth embodiment can be obtained.

(Other Embodiments)

Embodiments are not limited to the above embodiments and the above embodiments can be modified appropriately.

For example, in the first to eighth embodiments, a pad 22 formed on the one chip forming region 10 side and a pad 22 formed on the other chip forming region 10 side may not be formed alternately in the extending directions of a dicing line 20. For example, in the extending directions of a dicing line 20, only one pad 22 is formed on the one chip forming region 10 side and the remaining pads 22 may be formed on the other chip forming region 10 side.

Further, in the ninth embodiment, the number of prove needles installed in a testing apparatus may not be three but be two or not less than four. Furthermore, the intervals of the tips of probe needles abutting pads 22 may be different from each other. When such a testing apparatus is used too, the same effects as the ninth embodiment can be obtained by arranging pads 22 in conformity with the arrangement shape of probe needles.

In addition, the above embodiments can be combined appropriately. For example, a connection-via 28 comprising a metal different from a wiring layer 24 and a pad 22 may be embedded into a via-hole 27 by combining the seventh embodiment with one of the second to sixth embodiments and the ninth embodiment. Otherwise, a reinforcing film 29 may be arranged over a protective insulation film 26. Then the ninth embodiment may be combined with each of the second to eighth embodiments, thus pads 22 of the same number as probe needles in a testing apparatus may be grouped into a group 22a, and the pads 22 in the group 22a may be arranged in conformity with the arrangement shape of the probe needles. Moreover, the combinations of the above embodiments may further be combined with each other.

The invention claimed is:

1. A semiconductor wafer comprising:
a plurality of chip forming regions partitioned by a dicing line extending along a length of a wafer;
a plurality of inspection elements formed in the dicing line of the wafer and having same characteristics as semiconductor elements formed in the respective chip forming regions; and
a plurality of pads formed in the dicing line and connected electrically to the respective inspection elements,
wherein:
a width of the dicing line is larger than a cut region to be diced with a dicing blade;
the plurality of chip regions includes a first chip forming region and a second chip forming region that are adjacent and have the dicing line therebetween;
a portion of some of the plurality of pads extend beyond a first edge of the dicing line and are formed on the first chip forming region side;
a portion of remaining pads of the plurality of pads extend beyond a second edge of the dicing line which is opposite the first edge and are formed on the second chip forming region side; and
the first and second edges of the dicing line correspond to dicing edges of the dicing blade and the plurality of pads are aligned not to abut the first and second edges of the dicing line.

2. The semiconductor wafer according to claim 1. comprising:
a wiring layer formed in the dicing line and connected electrically to the inspection elements; and
an insulation film formed over the wafer, wherein the wiring layer is inside the insulation film and the insulation film has via-holes exposing a part of the wiring layer,
wherein
the pads are formed over the insulation film and connected electrically and mechanically to the wiring layer through metal members embedded into the via-holes.

3. The semiconductor wafer according to claim 2, wherein the via-holes are formed in a region different from the cut region.

4. The semiconductor wafer according to claim 2, wherein a part of the wiring layer facing the pads is formed in a region different from the cut region.

5. The semiconductor wafer according to claim 2, wherein parts of the via-holes and the wiring layer facing the pads are formed only in the cut region.

6. The semiconductor wafer according to claim 2, wherein:
metal members embedded into the via-holes comprise a same metal as a metal constituting the pads; and parts of the pads embedded into the via-holes are depressed.

7. The semiconductor wafer according to claim 6, wherein the via-holes are formed under parts of the pads different from where probe needles installed in a testing apparatus are to abut.

8. The semiconductor wafer according to claim 2, wherein:
   metal members embedded into the via-holes are connection-vias comprising a metal different from a metal constituting the pads; and
   planes of the pads on an opposite side of the insulation film are planar.

9. The semiconductor wafer according to claim 8, wherein:
   the connection-vias comprise a metal containing tungsten; and
   the pads comprise a metal containing aluminum.

10. The semiconductor wafer according to claim 1, wherein
    an opening exposing an inner region of each of the pads is formed over the insulation film and a reinforcing film covering an outer periphery of each of the pads is formed over the insulation film.

11. The semiconductor wafer according to claim 1, wherein:
    the pads are grouped into groups, the number of pads in each group corresponding to the number of probe needles installed in a testing apparatus; and
    the pads in each group are arranged in a shape conforming with an arrangement shape of the probe needles.

* * * * *